United States Patent [19]
Ota

[11] Patent Number: 5,311,472
[45] Date of Patent: May 10, 1994

[54] REDUNDANT DECODER CIRCUIT

[75] Inventor: Ken Ota, Tokyo, Japan

[73] Assignee: NEC Corporation, Tokyo, Japan

[21] Appl. No.: 759,289

[22] Filed: Sep. 13, 1991

[30] Foreign Application Priority Data

Sep. 13, 1990 [JP] Japan .................................. 2-243086

[51] Int. Cl.$^5$ ............................................. G11C 17/16
[52] U.S. Cl. .................... 365/200; 365/225.7; 365/230.06
[58] Field of Search ................. 365/200, 230.06, 225.7

[56] References Cited
U.S. PATENT DOCUMENTS 5,058,059 10/1991 Matsuo et al. .................. 365/200 X Primary Examiner—Eugene R. LaRoche
Assistant Examiner—Do H. Yoo
Attorney, Agent, or Firm—Sughrue, Mion, Zinn, Macpeak & Seas

[57] ABSTRACT

A redundant decoder circuit includes a restoration circuit for restoring a decoder which activates a redundant memory cell. When the redundant memory cell which should store a predetermined information is disabled, the restoration circuit stops the decoder from supplying the active signal to the disabled memory cell. Therefore, the predetermined information is to be stored in another memory cell instead of the disabled memory cell, so that the redundant memory cell is used effectively.

5 Claims, 4 Drawing Sheets

REDUNDANT DECODER CIRCUIT

FIELD OF THE INVENTION

This invention relates to a redundant decoder circuit employed in a semiconductor memory device.

BACKGROUND OF THE INVENTION

A semiconductor memory device includes a redundant memory which stores a predetermined information instead of a main memory when a memory cell of the main memory is disabled, and a redundant decoder circuit supplies an active signal to the redundant memory in accordance with an address signal.

A conventional redundant decoder circuit includes a plurality of fuses which are cut to correspond to a content of the address signal. In this redundant decoder circuit, when an address signal corresponding to a normal memory cell of the main memory is applied to the redundant decoder circuit, no signal is applied to the redundant memory in accordance with the address signal, so that the redundant memory becomes inactive state. On the other hand, when an address signal corresponding to a disabled memory cell of the main memory is applied to the redundant decoder circuit, an active signal is applied to the redundant memory to activate a predetermined redundant memory cell.

According to the conventional redundant decoder circuit, however, there is a disadvantage in that if a redundant memory cell selected by the redundant decoder circuit is disabled, a semiconductor memory circuit is not used as a whole, even if there a normal redundant memory cell is available in the redundant memory. As a result, the semiconductor memory device must be replaced by another one to lower a fabricating yield.

SUMMARY OF THE INVENTION

Accordingly, it is an object of the invention to provide a redundant decoder circuit by which redundant memory cells are used effectively.

It is another object of the invention to provide a redundant decoder circuit which increases a fabricating yield of a semiconductor memory device.

According to the invention, a redundant decoder circuit comprises:

means for storing an address to designate a memory cell of a main memory which is disabled;

means fore generating a first decode signal, when an address signal coincides with the address stored in the storing means;

a memory cell of a redundant memory for storing information, when the first decode signal is generated; and means for restoring the generating means to generate a second decode signal which is an inverted signal of the first decode signal.

BRIEF DESCRIPTION OF THE DRAWINGS

The invention will be explained in more detail in conjunction with appended drawings; wherein.

DESCRIPTION OF THE PREFERRED EMBODIMENTS

Figure 1:
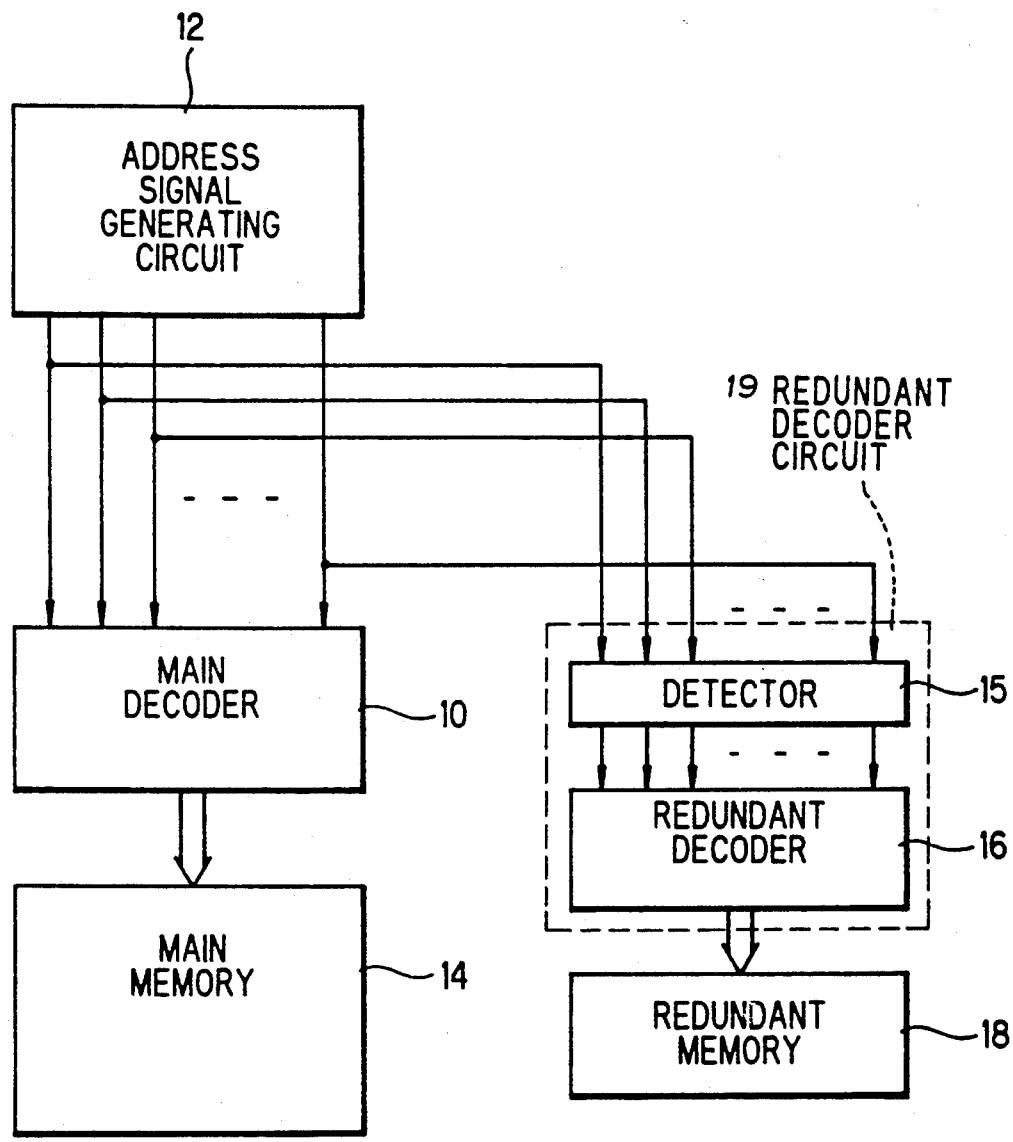
FIG. 1 is a block diagram showing a semiconductor memory circuit.

Before describing a redundant decoder circuit according to the invention, a semiconductor memory device having the redundant decoder circuit will be explained in conjunction with FIG. 1.

A semiconductor memory device includes a main decoder 10 connected to an address signal generating circuit 12, a main memory 14 connected to the main decoder 10, a detector 15 connected to the address signal generating circuit 12, a redundant decoder 16 connected to the detector 15 and a redundant memory 18 connected to the redundant decoder 16. The detector 15 and the redundant decoder 16 provide a redundant decoder circuit 19 in combination. An address of a disabled memory cell in the main memory 14 is stored in the detector 15, and the detector 15 detects the disabled address.

In this semiconductor memory device, when an address signal of n-bits is supplied to the main decoder circuit 10 and the detector 15, the main decoder circuit 10 supplies an active signal to the main memory 14 and the detector 15 compares the received address with the stored disabled address. When the received address does not correspond to the disabled address, the main memory 14 stores a predetermined information in a memory cell corresponding to the address. At this time, an active signal is not supplied from the redundant decoder circuit 16 to the redundant memory 18. On the other hand, if the received address corresponds to the disabled address, an active signal is supplied to the redundant memory 18. As a result, the redundant memory 18 stores a predetermined information instead of the main memory 14.

Figure 2:
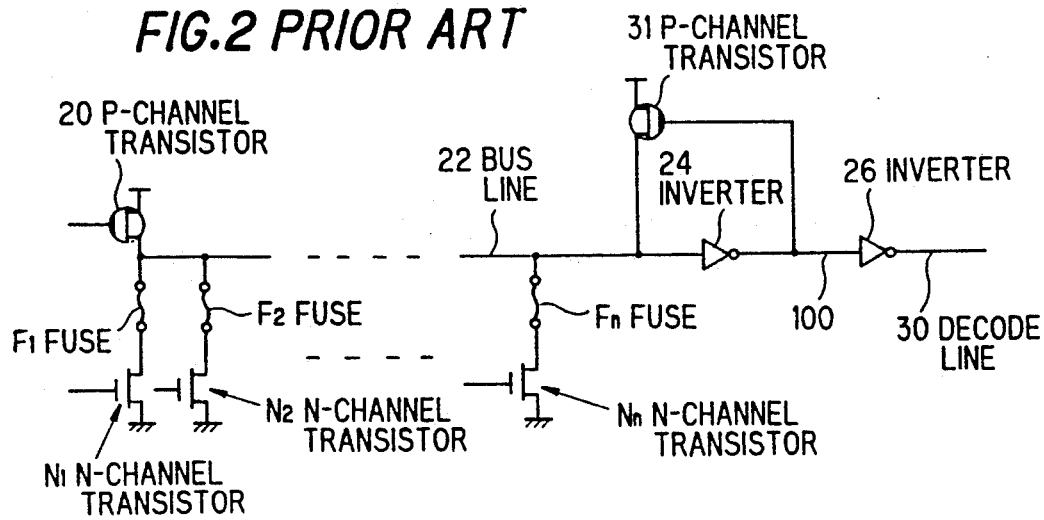
FIG. 2 is a circuit diagram showing a first conventional redundant decoder circuit.

Next, the conventional redundant decoder circuits briefly described before will be explained in conjunction with FIGS. 2 and 3. The first conventional redundant decoder circuit of dynamic type, shown in FIG. 2 which corresponds to the redundant decoder circuit 19 of FIG. 1, includes a P-channel transistor 20 connected at a source to a power supply, N-channel transistors N1, N2, ..., Nn each connected at a gate to the address signal generating circuit and at a drain to ground, fuses F1, F2, ..., Fn connected between a common drain of the P-channel transistor 20 connected to a bus line 22 and a corresponding source of the N-channel transistors N1, N2, ..., Nn, two inverters 24 and 26 positioned in series between the bus line 22 and a decode line 30, and a P-channel transistor 31 connected at a source to a power supply at a drain to the bus line 22, and at a gate to an output of the inverter 24. In this decoder, it is assumed that the fuse F2 is cut to store an address signal "0, ..., 1, 0".

Next, operation of the first conventional redundant decoder circuit will be explained in conjunction with a truth table shown below.

| | GATE LEVEL (ADDRESS SIGNAL) | | | BUS LINE | NODE | DECODE LINE |
|---|---|---|---|---|---|---|
| No. | Nn | N2 | N1 | 22 | 100 | 30 |
| 1 | 0 | 0 | 1 | 0 | 1 | 0 |
| 2 | 0 | 1 | 0 | 1 | 0 | 1 |

| | INPUT LEVEL | | | | | | OUTPUT LEVEL | | | DECODE LINE |
|---|---|---|---|---|---|---|---|---|---|---|
| | EX 1 | | EX 2 | | EX n | | | | | |
| NO. | 90 | 91 | 92 | 93 | 94 | 95 | EX 1 | EX 2 | EX n | 39 |
| 1 | 0 | 1 | 0 | 0 | 0 | 0 | 0 | 0 | 1 | 0 |
| 2 | 0 | 0 | 1 | 1 | 0 | 0 | 1 | 1 | 1 | 1 |

When an address signal corresponding to a normal memory cell of the main memory 14, for instance a signal of "0, ..., 0, 1" as shown in the table by No. 1 is applied to gates of the N-channel transistors Nn, ... N2, N1, respectively, the N-channel transistor N1 becomes ON state in accordance with the bit of level "1", so that the P-channel transistor 20 is discharged. Therefore, a level of the bus line 22 becomes "0" and a level at a node 100 becomes "1", so that a level of the decode line 30 becomes "0". As the result, the redundant memory 18 becomes inactive state, so that a predetermined information which is to be written is stored in the main memory.

On the other hand, when an address signal corresponding to a disabled memory cell of the main memory, for instance a signal of "0, ..., 1, 0" as shown in the table by No. 2 is applied to the gates of the N-channel transistors Nn, ..., N2, N1, respectively, the N-channel transistor N2 becomes ON state in accordance with the bit of level "1". In spite of the turning-on of the transistor N2, a level of the bus line 22 remains uncharged to be "1", and a level at the node 100 is "0", so that a level of the decode line 30 is "1". Therefore, a signal of level "1" is applied to the redundant memory, so that the redundant memory becomes active. As the result, a predetermined information which is to be written is stored in a memory cell of the redundant memory instead of the main memory.

Figure 3:
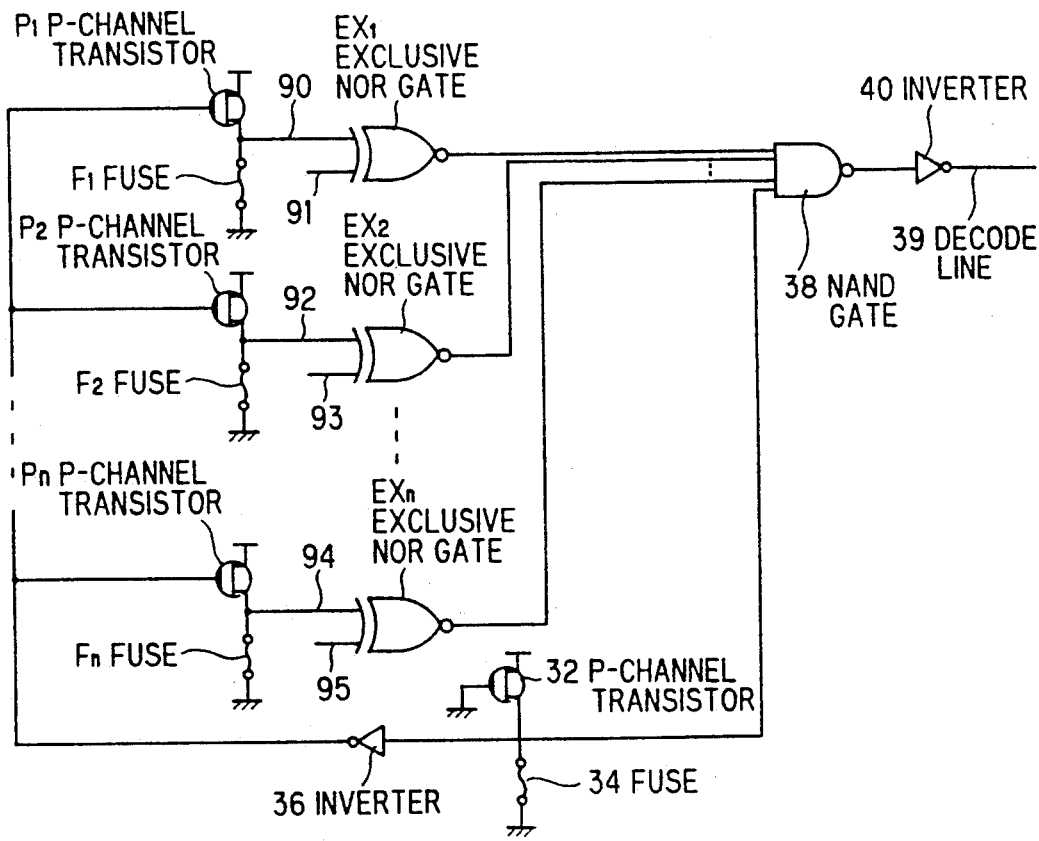
FIG. 3 is a circuit diagram showing a second conventional redundant decoder circuit.

Next, a second conventional redundant decoder circuit of static type will be explained in conjunction with FIG. 3. The redundant decoder circuit which corresponds to the redundant decoder circuit 19 of FIG. 1 includes P-channel transistors P1, P2, ..., Pn each connected at a source to a power supply, fuses F1, F2, ..., Fn respectively connected between a corresponding drain of the P-channel transistors P1, P2, ..., Pn and ground, a P-channel transistor 32 connected at a source to a power supply and at a gate to ground, a fuse 34 connected between a drain of the P-channel transistor 32 and ground, an inverter 36 connected at an input to a node between the P-channel transistor 32 and the fuse 34 and at an output to gates of the P-channel transistors P1, P2, ..., Pn, exclusive NOR gates EX1, EX2, ..., EXn connected at inputs to lines 90 and 91, 92 and 93, and 94 and 95, respectively, a NAND gate 38 connected at inputs to outputs of the exclusive NOR gates EX1, EX2, ..., EXn, and an inverter 40 connected at an input to an output of the NAND gate 38 and at an output to an decode line 39. The lines 90, 92 and 94 are connected to nodes between the P-channel transistor P1 and fuse F1, P2 and F2, and Pn and Fn, respectively. Each of the lines 91, 93 and 95 is connected to the address signal generating circuit. Here, it is assumed that the fuse F2 is cut, the remaining fuses are not cut.

Next, operation of the second conventional redundant decoder circuit will be explained in conjunction with a truth table shown below.

At first, the decoder circuit is activated by cutting the fuse 34, so that the P-channel transistors P1, P2, ..., Pn are turned on.

When an address signal corresponding to a normal memory cell of the main memory, for instance, a signal of "0, ..., 0, 1" as shown in the table by No. 1 is applied to the exclusive NOR gates Exn, ..., Ex2, Ex1 from the address lines 91, 93 and 95, signals of level "0" are applied from the exclusive NOR gates EX1 and EX2 to the NAND gate 38, and a signal of level "1" is supplied from the exclusive NOR gate EXn and the P-channel transistor 32 to the NAND gate 38, so that an output level of the NAND gate 38 becomes "1", and a level of the decode line 39 becomes "0". As the result, the redundant memory becomes inactive state, so that a predetermined information which is to be written is stored in the main memory.

On the other hand, when an address signal corresponding to a disabled memory cell of the main memory, for instance, a signal of "0, ..., 1, 0" as shown in the table by No. 2 is applied to the exclusive NOR gates EXn, ..., EX2, EX1 from the address lines 91, 93 and 95, respectively, so that signals of level "1" are applied from the all exclusive NOR gates EX1, EX2, .., EXn and the P-channel transistor 32 to the NAND gate 38, respectively. Thus, an output level of the NAND gate 38 becomes "0", and a level of the decode line 39 becomes "1". As the result, the redundant memory becomes active state, so that a predetermined information which is to be written is stored in an addressed memory cell of the redundant memory instead of the main memory.

According to the first and second conventional redundant decoder circuits, however, there is a disadvantage in that if a selected memory cell of the redundant memory is disabled, a semiconductor memory circuit is no longer used, even if there is left a normal memory cell in the redundant memory, as described before.

Figure 4:
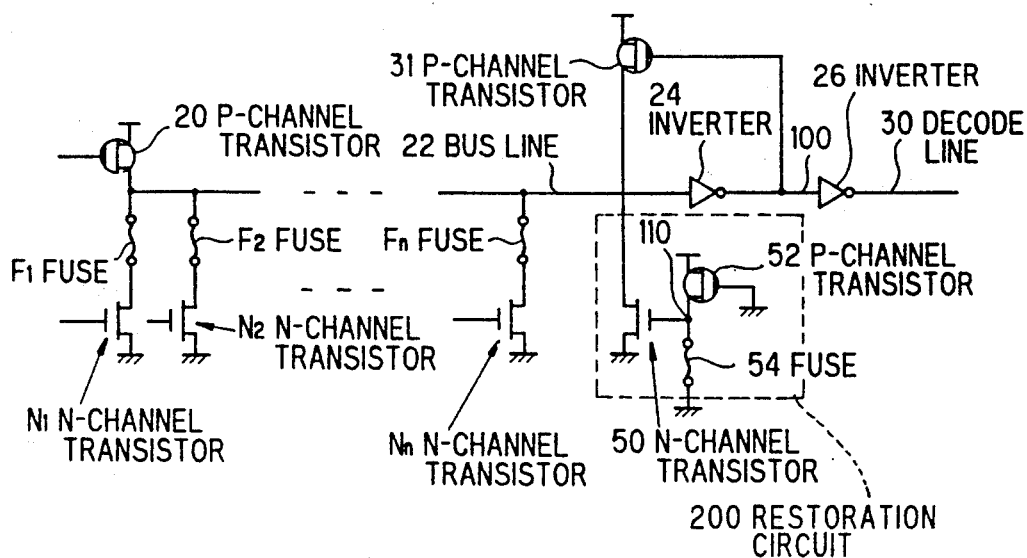
FIG. 4 is a circuit diagram showing a redundant decoder circuit of a first preferred embodiment according to the invention.

Next, a redundant decoder circuit of dynamic type of a first preferred embodiment according to the invention will be explained in conjunction with FIG. 4. The redundant decoder circuit of dynamic type includes a P-channel transistor 20 connected at a source to a power supply, N-channel transistors N1, N2, ..., Nn each connected at a gate to the address signal generating circuit and at a drain to ground, fuses F1, F2, ..., Fn connected between a common drain of the P-channel transistor 20 connected to a bus line 22 and a corresponding source of the N-channel transistors N1, N2, ..., Nn, respectively, two inverters 24 and 26 positioned in series between the bus line 22 and an decode line 30, a P-channel transistor 31 connected at a source to a power supply at a drain to the bus line 22, and at a gate to an output of the inverter 24, and a restoration circuit 200. In this decoder, it is assumed that the fuse F2 is cut to store an address signal "0, ..., 1, 0".

The restoration circuit consists of an N-channel transistor 50 connected at a source to a bus line 22 and at a drain to ground, a P-channel transistor 52 connected at a source to a power supply and at a gate to ground, and a fuse 54 connected between a drain of the P-channel transistor 52 and ground. The N-channel transistor 50 is connected at a gate to a node 110 between the drain of the P-channel transistor 52 and the fuse 54.

Next, operation of the first preferred embodiment will be explained in conjunction with a truth table shown below.

| NO. | GATE LEVEL (ADDRESS SIGNAL) | | | NODE 110 | BUS LINE 22 | NODE 100 | DECODE LINE 30 |
|---|---|---|---|---|---|---|---|
| | Nn | N2 | N1 | | | | |
| 1 | 0 | 0 | 1 | 0 | 0 | 1 | 0 |
| 2 | 0 | 1 | 0 | 0 | 1 | 0 | 1 |
| 3 | 0 | 1 | 0 | 1 | 0 | 1 | 0 |

When an address signal corresponding to a normal memory cell of the main memory, for instance, a signal of "0, ..., 0, 1" as shown in the table by No. 1 is applied to gates of the N-channel transistors Nn, ..., N2, N1, respectively, the N-channel transistor N1 becomes ON state in accordance with the bit of level "1", so that the P-channel transistor 20 is discharged. Therefore, a level of the bus line 22 becomes "0" and a level at a node 100 becomes "1", so that a level of the decode line 30 becomes "0". As the result, the redundant memory 18 becomes inactive state, so that a predetermined information which is to be written is stored in the main memory.

On the other hand, when an address signal corresponding to a disabled memory cell of the main memory, for instance, a signal of "0, ..., 1, 0" as shown in the table by No. 2 is applied to the gates of the N-channel transistors Nn, ..., N2, N1, respectively, the N-channel transistor N2 becomes ON state in accordance with the bit of level "1". In spite of the turning-on the transistor N2, a level of the bus line 22 remains unchanged to be "1", and a level at the node 100 is "0", so that a level of the decode line 30 is "1". Therefore, a signal of level "1" is applied to the redundant memory, so that the redundant memory becomes active. As the result, a predetermined information which is to be written is stored in a memory cell of the redundant memory instead of the main memory 14.

At this time, if the memory cell of the redundant memory which is addressed to store the predetermined information is judged to be disabled, the fuse 54 is disconnected in the restoration circuit 200. Then, a signal of level "1" is applied to the gate of the N-channel transistor 50 through the node 110, so that a level of the bus line 22 becomes "0", and a level of the decode line 30 becomes "0", as shown in the table by No. 3. Therefore, the addressed memory cell of the redundant memory becomes inactive state. Thus, the predetermined information is to be stored in another memory cell of the redundant memory instead of the disabled memory cell thereof by cutting a fuse corresponding to the fuse F2.

Figure 5:
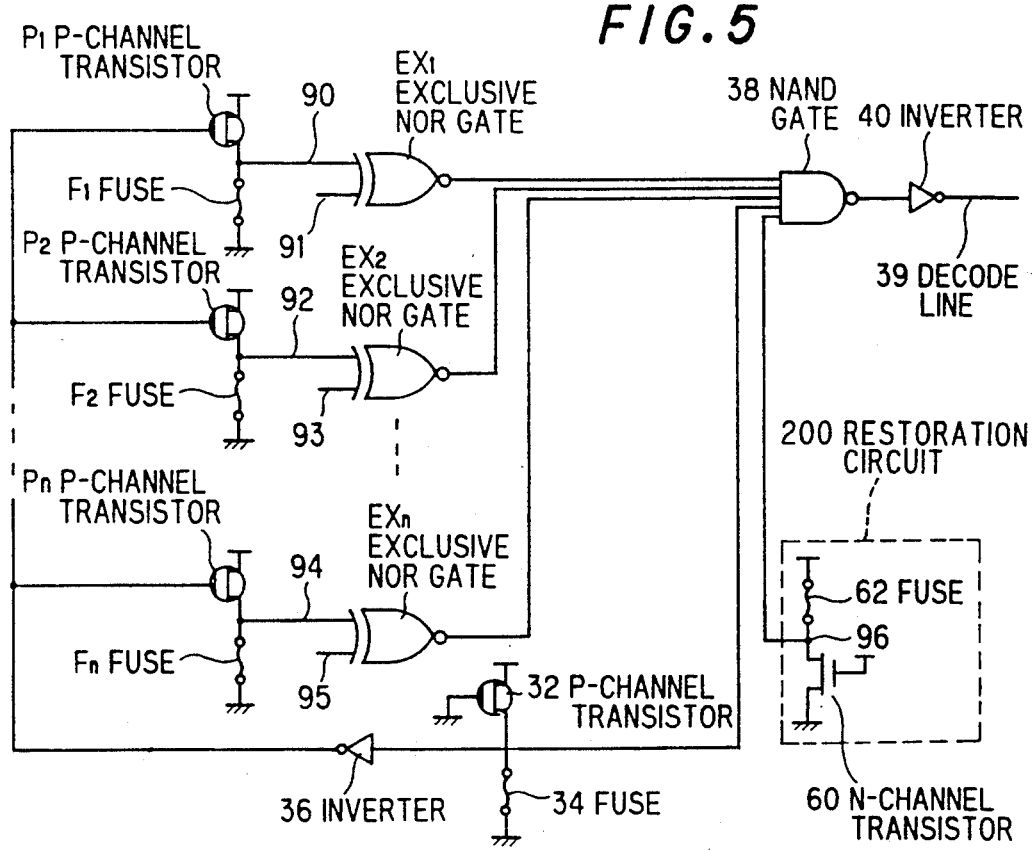
FIG. 5 is a circuit diagram showing a redundant decoder circuit of a second preferred embodiment according to the invention.

Next, a redundant decoder circuit of static type of a second preferred embodiment according to the invention will be explained in conjunction with FIG. 5. The redundant decoder circuit includes P-channel transistors P1, P2, ..., Pn each connected at a source to a power supply, fuses F1, F2, ..., Fn respectively connected between a corresponding drain of the P-channel transistors P1, P2, ..., Pn and ground, a P-channel transistor 32 connected at a source to a power supply and at a gate to ground, a fuse 34 connected between a drain of the P-channel transistor 32 and ground, an inverter 36 connected at an input to a node between the P-channel transistor 32 and the fuse 34 and at an output to gates of the P-channel transistors P1, P2, ..., Pn, exclusive NOR gates EX1, EX2, ..., EXn connected at inputs to lines 90 and 91, 92 and 93, and 94 and 95, respectively, a NAND gate 38 connected at inputs to outputs of the exclusive NOR gates EX1, EX2, ..., EXn, an inverter 40 connected at an input to an output of the NAND gate 38 and at an output to an decode line 39, and a restoration circuit 200.

The lines 90, 92 and 94 are connected to nodes between the P-channel transistor P1 and fuse F1, P2 and F2, and Pn and Fn, respectively. Each of the lines 91, 93 and 95 is connected to the address signal generating circuit. The restoration circuit 200 consists of an N-channel transistor 60 connected at a drain to ground and at a gate to a power supply, and a fuse 62 connected between a power supply and a source of the N-channel transistor 60. A node 96 between the N-channel transistor 60 and the fuse 62 is connected to one of inputs of the NAND gate 38.

Next, operation of the second preferred embodiment will be explained in conjunction with a truth table shown below.

| NO. | INPUT LEVEL | | | | | | OUTPUT LEVEL | | | NODE 96 | DECODE LINE 39 |
|---|---|---|---|---|---|---|---|---|---|---|---|
| | EX 1 | | EX 2 | | EX n | | EX 1 | EX 2 | EX n | | |
| | 90 | 91 | 92 | 93 | 94 | 95 | | | | | |
| 1 | 0 | 1 | 0 | 0 | 0 | 0 | 0 | 0 | 1 | 1 | 0 |
| 2 | 0 | 0 | 1 | 1 | 0 | 0 | 1 | 1 | 1 | 1 | 1 |
| 3 | 0 | 0 | 1 | 1 | 0 | 0 | 1 | 1 | 1 | 0 | 0 |

At first, the decoder circuit is activated by cutting the fuse 34, so that the P-channel transistors P1, P2, ..., Pn are turned on.

When an address signal corresponding to a normal memory cell of the main memory, for instance, a signal of "0, ..., 0, 1" as shown in the table by No. 1 is applied to the exclusive NOR gates EXn, ..., EX2, EX1 from the address lines 91, 93 and 95, signals of level "0" are applied from the exclusive NOR gates EX1 and EX2 to the NAND gate 38, and a signal of level "1" is supplied from the exclusive NOR gate EXn and the P-channel transistor 32 to the NAND gate 38, so that an output level of the NAND gate 38 becomes "1", and a level of the decode line 39 becomes "0". As the result, the redundant memory becomes inactive state, so that a predetermined information which is to be written is stored in the main memory.

On the other hand, when an address signal corresponding to a disabled memory cell of the main memory, for instance, a signal of "0, ..., 1, 0" as shown in the table by No. 2 is applied to the exclusive NOR gates EXn, ..., EX2, EX1 from the address lines 91, 93 and 95, respectively, so that signals of level "1" are applied from the all exclusive NOR gates EX1, EX2, ..., EXn and the P-channel transistor 32 to the NAND gate 38, respectively. Thus, an output level of the NAND gate 38 becomes "0", and a level of the decode line 39 becomes "1". As the result, the redundant memory becomes active state, so that a predetermined information which is to be written is stored in an addressed memory cell of the redundant memory instead of the main memory.

At this time, if the addressed memory cell which should store the predetermined information is judged to be disabled, the fuse 62 is disconnected. A level of the node 96 becomes "0", so that a signal of level "0" is applied to one of inputs of the NAND gate 38. Therefore, a level of the output line 39 becomes "0", so that the addressed memory cell of the redundant memory becomes inactive state as shown in the table by No. 3. As the result, the predetermined information is to be stored in another memory cell of the redundant memory instead of the disabled memory cell thereof by cutting a fuse corresponding to the fuse F2.

Figure 6:
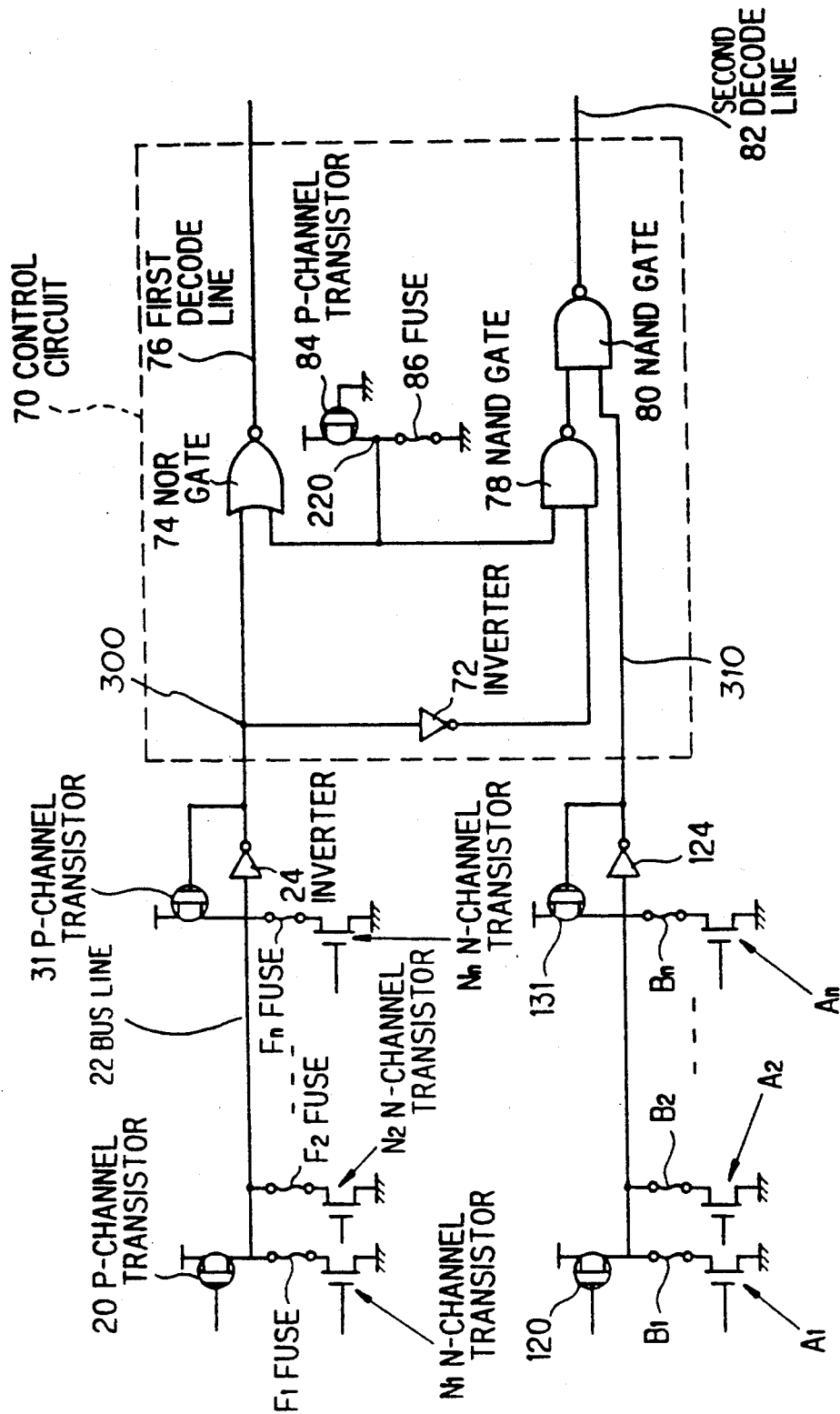
FIG. 6 is a circuit diagram showing a redundant decoder circuit of a third preferred embodiment according to the invention.

Next, a redundant decoder circuit of dynamic type of a third preferred embodiment according to the invention will be explained in conjunction with FIG. 6. The redundant decoder circuit includes a first and second decoder circuits and a control circuit 70 connected between the first and second decoder circuits.

The first decoder circuit includes a P-channel transistor 20 connected at a source to a power supply, N-channel transistors N1, N2, ..., Nn each connected at a gate to the address signal generating circuit and at a drain to ground, fuses F1, F2, . ... , Fn connected between a common drain of the P-channel transistor 20 connected to a bus line 22 and a corresponding source of the N-channel transistors N1, N2, ..., Nn, respectively, an inverter 24, and a P-channel transistor 31 connected at a source to a power supply. The second decoder circuit has the same structure as the first decoder circuit. In the second decoder circuit, a P-channel transistor 120 corresponds to the transistor 20, fuses B1, B2 and Bn corresponds respectively to the fuses F1, F2 and Fn, N-channel transistors A1, A2 and An correspond respectively to the N-channel transistors N1, N2 and Nn, a P-channel transistor 131 corresponds to the transistor 31, and an inverter 124 corresponds to the inverter 24.

The control circuit 70 includes an inverter 72 connected at an input to an output of the first decoder circuit, a NOR gate 74 connected at one of inputs to the output of the first decoder circuit through a node 300 and at an output to a first decode line 76, a NAND gate 78 connected at one of inputs to an output of the inverter 72, a NAND gate 80 connected at inputs to outputs of the NAND gate 78 and the inverter 124 through a line 310 and at an output to a second decode line 82, a P-channel transistor 84 connected at a source to a power supply and at a gate to ground, and a fuse 86 connected between ground and a drain of the P-channel transistor 84 through a node 220.

Next, operation of the third preferred embodiment will be explained in conjunction with a truth table shown below, wherein "*" indicates any level. In this explanation, operation of the control circuit 70 will be explained in more detail than operation corresponding to the first preferred embodiment.

| No. | INVERTER 24 | INVERTER 124 | NODE 220 | NAND GATE 78 | DECODE LINE 76 | DECODE LINE 82 |
|-----|-------------|--------------|----------|--------------|----------------|----------------|
| 1 | 1 | * | 0 | * | 0 | * |
| 2 | 0 | * | 0 | * | 1 | * |
| 3 | 0 | 1 | 1 | 0 | 0 | 1 |

When an address signal corresponding to a normal memory cell of the main memory is applied to the first decoder circuit (No. 1), a signal of level "1" is applied from the inverter 24 to the control circuit 70, in which signal of level "1" is applied to the NOR gate 74, along with a signal at the node 220 which is "0" by non-disconnection of the fuse 86.

Therefore, a level of the first decode line 76 becomes "0", so that a memory cell of the redundant memory which is to be accessed by the first decode line 76 becomes inactive state.

On the other hand, when an address signal corresponding to a disabled memory cell of the main memory and addressing the first decode line 76 is applied to the first decoder circuit (No. 2), a signal of level "0" is applied from the inverter 24 to the control circuit 70. Then, a level of the first decode line 76 becomes "1", so that the memory cell of the redundant memory which is to be accessed by the first decode line 76 becomes active state.

At this time, if the accessed memory cell of the redundant memory which should store a writing information in place of a memory cell of the main memory is judged to be disabled, the fuse 86 is disconnected (No. 3). As the result, signal of level "1" is applied to the NOR gate 74 from the node 220, so that a level of the first decode line 76 becomes "0". On the other hand, both signals of level "1" are applied to the NAND gate 78 from the node 220 and the inverter 72, respectively, so that a signal of level "0" is applied from the NAND gate 78 to the NAND gate 80. At this time, if a level of output signal of the inverter 124 is "1", a level of the second decode line 82 becomes "1". Therefore, a memory cell of the redundant memory which is to be addressed by the second decode line 82 becomes active state, so that a predetermined information is stored in the addressed memory cell instead of the memory cell connected with the first decode line 76.

In this third preferred embodiment, the first and second decoder circuits may decode first and second address signal, respectively, to enable the first and second decode lines 76 and 82, so that an information is written into two corresponding redundant memory cells in place of two disabled main memory cells, when the first and second address signals coincide with stored address signals determined by the cut patterns of the fuse F1, F2, ..., Fn and the fuse B1, B2, ..., Bn of the first and second decoder circuits.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A redundant decoder circuit comprising:
   means for storing an address to designate a memory cell of a main memory which is disabled;

means for generating a first decode signal, when an address signal coincides with said address stored in said storing means;

a memory cell of a redundant memory for storing information, when said first decode signal is generated; and means for restoring said generating means to generate a second decode signal which is an inverted signal of said first decode signal, said restoring means being activated at a time when said memory cell of said redundant memory is disabled.

2. A redundant decoder circuit, according to claim 1, wherein:

said storing means, comprises:

a plurality of fuses, some of which are cut in accordance with said address to designate said memory cell of said main memory.

3. A redundant decoder circuit, according to claim 2, wherein:

said storing means, comprises:

a fuse connected to a fixed potential determined by one of a power supply voltage and a ground level; and a transistor for supplying said generating means with said fixed potential signal, when said fuse is cut, said second decode signal being generated in accordance with said fixed potential.

4. A redundant decoder circuit comprising:

a first decoder circuit for generating a first decode signal in accordance with a first address signal, by which a first memory cell of a redundant memory is addressed;

a second decoder circuit for generating a second decode signal in accordance with a second address signal, by which a second memory cell of a redundant memory is addressed; and a control circuit for addressing said second memory cell in accordance with said first decode signal, when said first memory cell is disabled.

5. A redundant decoder circuit, according to claim 4, wherein:

said control circuit, comprises:

a fuse which is cut, when said first memory cell is disabled;

means for inverting said first decode signal thereby to become non-active state, when said fuse is cut; and means for generating said second decode signal under a state that said second address signal is not generated, when said fuse is cut.

* * * * *